United States Patent [19]

Rydval et al.

[11] 4,253,034
[45] Feb. 24, 1981

[54] INTEGRATABLE SEMI-CONDUCTOR MEMORY CELL

[75] Inventors: Peter Rydval; Ulrich Schwabe, both of Munich, Fed. Rep. of Germany

[73] Assignee: Siemens Aktiengesellschaft, Berlin & Munich, Fed. Rep. of Germany

[21] Appl. No.: 937,917

[22] Filed: Aug. 30, 1978

[30] Foreign Application Priority Data

Aug. 31, 1977 [DE] Fed. Rep. of Germany ....... 2739283

[51] Int. Cl.$^3$ ...................... G11C 11/40; H03K 3/286
[52] U.S. Cl. .................................. 307/238; 307/292; 307/317 A; 365/155
[58] Field of Search ............... 307/238, 289, 291, 292, 307/317 A; 365/154, 155

[56] References Cited

U.S. PATENT DOCUMENTS

| 3,573,758 | 4/1971 | Henle et al. | 307/238 X |
| 3,610,967 | 10/1971 | Palfi | 307/279 X |
| 3,626,390 | 12/1971 | Chang et al. | 307/279 X |
| 3,631,309 | 12/1971 | Myers | 307/279 X |
| 3,671,772 | 6/1972 | Henle | 307/238 X |
| 3,821,719 | 6/1974 | Taniguchi et al. | 307/291 X |
| 3,849,675 | 11/1974 | Waaben | 307/238 X |
| 3,886,531 | 5/1975 | McNeill | 307/291 X |
| 3,909,807 | 9/1975 | Fulton | 307/279 X |
| 3,973,246 | 8/1976 | Millhollan et al. | 365/154 X |
| 4,125,877 | 11/1978 | Reinert | 307/317 A X |

FOREIGN PATENT DOCUMENTS 2204562 8/1973 Fed. Rep. of Germany .
1774929 1/1975 Fed. Rep. of Germany .

OTHER PUBLICATIONS

Wiedmann, "Monolithic Circuit with Pinch Resistor", *IBM Tech. Discl. Bull.*, vol. 13, No. 9, pp. 2469; 2/1971.
Moore, "Schottky Barrier Diode Storage Cell"; *IBM Tech. Discl. Bull.*; vol. 14, No. 6, pp. 1683; 11/1971.
Beers et al, "Integrated Harper Cell"; *IBM Tech. Discl. Bull.*; vol. 18, No. 9, pp. 2875-2877; 2/1976.

Primary Examiner—Larry N. Anagnos
Attorney, Agent, or Firm—Hill, Van Santen, Steadman, Chiara & Simpson

[57] ABSTRACT

An integratable semi-conductor memory cell has two bipolar transistors which are identical to one another and which have their collectors connected in series with respective circuit parts having a non-linear current characteristic, the respective circuit parts being connected to a first electrical potential. The circuit parts are also connected to the base of the other respective transistor. One emitter of each of the transistors is provided for control by means of logic signals and the invention is particularly characterized in that the circuit part located between the collector of each one of the transistors and a switching point carrying the first electrical potential are selected in such a fashion that the slope dU/dI of the current-voltage characteristic will always be higher than the slope of the corresponding current values in the current-voltage characteristic of the pn-junctions of the emitter-base circuit of both transistors.

1 Claim, 5 Drawing Figures

INTEGRATABLE SEMI-CONDUCTOR MEMORY CELL

BACKGROUND OF THE INVENTION

1. Field of the Invention

The present invention relates to an integratable semiconductor memory cell having two bipolar transistors which are identical with one another and whose collectors are connected in series with respective circuit portions which have a non-linear current characteristic, and in which the circuit portions are connected in common to a first electrical potential and are respectively connected to the base of the opposite transistor, and more particularly to such a circuit in which an emitter of each of the transistors is provided for receiving logic control signals.

2. Description of the Prior Art

Memory cells of the type mentioned above are generally described in the German Published Application No. 17 74 929 and in the German Patent No. 2,204,562. The non-linear circuit portion in the current supply circuit of the collectors of both transistors, in the first case, is a diode having a pn-junction, and in the second case is a diode having a Schottky contact. In each case, the transistors are provided with two emitters, whereby one emitter each of the one transistor is connected to one emitter each of the second transistor and are connected to a second electrical potential, while the unconnected emitters of the transistors are used as inputs for receiving logic control signals.

A further improvement in circuits of the type mentioned above is illustrated in FIG. 1. The improvement relates to a double emitter memory cell having a pn diode load and a resistor connected in parallel with the diode load. The advantage of such arrangements lies in load dissipation losses, particularly in the rest condition of the memory cell, as well as in a good possibility of realization as a monolithically integrated semi-conductor circuit. In a selected state, such a memory cell can consume high currents, so that the recording and reading of data in memories integrated from such memory cells can be accomplished at a very high speed. The embodiment represented in FIG. 1 distinguishes itself additionally by a minimum of quiescent current, a favorable recording pulse width and good packing density.

According to the circuit illustrated in FIG. 1, a connection point A carrying the first electrical potential is connected by way of respective diodes $D_1$ and $D_2$, poled in the forward direction, and a series resistor $R_{S1}$ and $R_{S2}$, respectively, at the collectors of the npn transistors $T_1$ and $T_2$. In addition, the collector of each of the two transistors is connected, by way of an additional ohmic resistor $R_{P1}$ and $R_{P2}$ to the point A. Finally, each collector is connected to the base of the other transistor so that both the transistors are cross-coupled.

Both of the transistors $T_1$ and $T_2$ are provided with two emitters. One emitter of each transistor is connected to a like emitter of the other transistor and in common therewith to a second switching terminal B, while the other emitters of the transistors receive logic control signals at the respective inputs $L_1$ and $L_2$.

The voltage $\Delta U$ between the collectors of the transistors $T_1$ and $T_2$ is critical for the electrical performance of such a memory cell. In FIG. 2 the function of the current $I_Z$ flowing by way of both the terminals A and B is illustrated. If the resistors $R_{S1}$ and $R_{S2}$ have the value zero, the parallel resistors $R_{P1}$ and $R_{P2}$ a value of infinity, so that the collectors of the transistors $T_1$ and $T_2$ are merely connected to the point A by way of both diodes $D_1$ and $D_2$, the voltage $\Delta U$ is independent of the current $I_Z$, that is a straight line extending parallel with the abscissa at a distance of less than 0.1 volt. It should be noted in this respect that on the abscissa of the natural logarithm of the current value is plotted, while the ordinate $\Delta U$ is linear.

It would be desirable for the voltage $\Delta U$ to have values higher than 0.1. This is accomplished by the resistors provided in FIG. 1. However, as can be seen from FIG. 2, the voltage $\Delta U$ no longer remains connected purely exponentially with the memory cell current $I_Z$; rather, the operating condition for the memory cell depends to a large extent on the operating point set by the resistors $R_S$ and $R_P$, because the recording pulse width, the scope of parasitic substrate currents and the static freedom from interference depend on the voltage $\Delta U$. Moreover, a switching relation between the rest current and the operating current exceeding beyond the value 100 cannot be set safely without problems.

In the curves for $\Delta U$ shown in the diagram according to FIG. 2, in each case the value shown in the diagram and indicated at the curve involved is used for the two parallel resistors $R_{P1}$ and $R_{P2}$, while the series resistors $R_{S1}$ and $R_{S2}$ are determined to be 300 ohms, the temperature voltage $U_T$ of the diodes $D_1$ and $D_2$ is determined to be 28 millivolts, the saturation current $I_o$ for the individual diode is $0.3 \times 10^{-15}$ amps and the static amplification of each of the two transistors $T_1$ and $T_2$ is determined to be 20. The curves were derived by computation and verified experimentally.

Bearing in mind that such a memory cell is consolidated in the art with a multiplicity of identical memory cells, integrated monolithically into a memory matrix and since, moreover, for static reasons it is almost impossible that in the manufacture of such a matrix via all points to be subjected to a certain production apparatus, of a semi-conductor disc, identical conditions will prevail everywhere, the behavior of the voltage $\Delta U$ between the collectors of both transistors $T_1$ and $T_2$ of an apparatus according to FIG. 1 is unfavorable.

If, on the other hand, the use of the resistors $R_{S1}$, $R_{S2}$, $R_{P1}$, $R_{P2}$ is waived, so that the power supply of both the transistors $T_1$ and $T_2$ is accomplished exclusively by way of the two diodes $D_1$ and $D_2$ equipped either as pn diodes or Schottky diodes, in fact the voltage $\Delta U$ becomes independent of the setting of the operating point of the memory cell involved. However, the slope of the characteristic curve is too small and thus the voltage $\Delta U$ is too low to assure an adequate static and dynamic freedom from interference of the memory cell and thus of the entire memory at the desired high densities of integration.

SUMMARY OF THE INVENTION

It would therefore be desirable for the voltage $\Delta U$ between the collectors of the transistors to be analogous with the case of the use of a diode $D_1$ and/or $D_2$ without the resistors $R_S$ and $R_P$, independent of the logarithm of the operating current $I_Z$, but if on the other hand, the value of this voltage $\Delta U$ were higher than 0.1 volt.

In this respect, it is proposed, according to the present invention, that the circuit portion located between the collector of each of the transistors $T_1$ and $T_2$ and the point A carrying the first electrical potential be selected in such a manner that the slope dU/dI of the current-voltage characteristic will always be higher than the slope at the corresponding current values in the current-voltage characteristic of the pn-junctions of the emitter-base circuit of both transistors $T_1$ and $T_2$.

This means, in other words, that the slope of the voltage along the individual circuit portion is greater at all points of its current-voltage characteristic than that of a simple pn diode and/or a Schottky diode.

This object is achieved most simply and most favorably by connecting the collectors of both transistors $T_1$ and $T_2$ by way of two or more diodes, connected in series in each case, most advantageously via diodes of the Schottky type, to the point A which carries the first potential. It is appropriate to forego the use of additional ohmic resistors, perhaps of the type represented in FIG. 1, as thereby again additional fluctuations could be induced. Therefore, it is most favorable for the characteristic of the circuit portions located between the point A and the collector of the transistors involved to have a purely exponential character.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
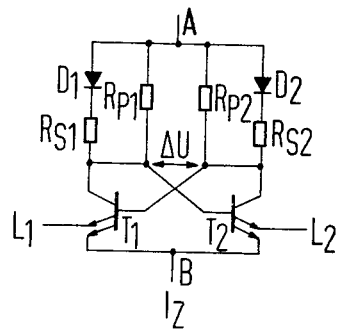
FIG. 1 is a schematic circuit diagram of an improved two-transistor memory cell.
Figure 3:
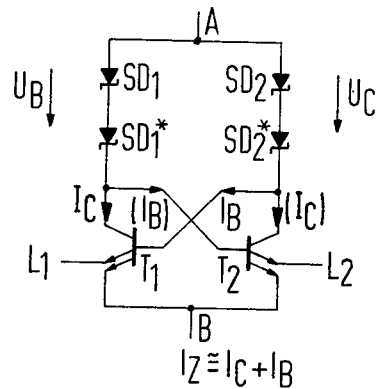
FIG. 3 is a schematic circuit diagram of an embodiment of the invention.

Particularly favorable results were obtained with a memory cell constructed in accordance with FIG. 3. The memory cell only differs from the arrangement represented in FIG. 1 by the circuit portion between the point A and the collectors of the transistors $T_1$ and $T_2$.

Figure 2:
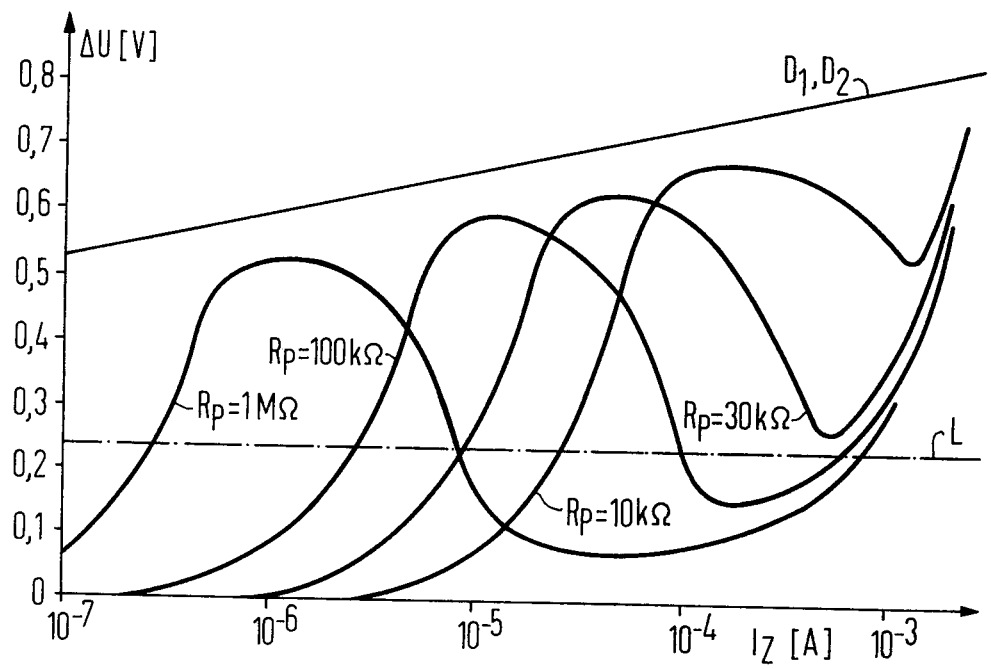
FIG. 2 is a graphic illustration of the voltage $\Delta U$ plotted with respect to the total current $I_Z$, i.e. a current-voltage characteristic.

In fact, the memory cell comprises for each of these circuit portions, two Schottky diodes $SD_1$, $SD_1^*$ and $SD_2$, $SD_2^*$. The voltage $\Delta U$ obtained with the aid of such a design is remarkably higher than in the case of a single diode, namely at the horizontal straight line L illustrated by dots and dashes in FIG. 2, that is between 0.2 and 0.3 volts. By using, in each case, three diodes connected in series and in the direction of current flow, the voltage $\Delta U$ still becomes greater.

Regarding the manner of operation of a circuit constructed in accordance with the present invention, the following consideration is provided as an explanation. For the static current amplification B of the transistor $T_1$ and/or the transistor $T_2$, the following equation applies.

$$B = (I_C/I_B) = \text{constant}.$$

In addition, and as can be seen from FIG. 3, the following relationship also applies.

$$\Delta U = U_C - U_B.$$

The diode line of characteristics produces the following relationships.

$$I_C = I_o \exp(U_C:U_T) \text{ and/or}$$

$$I_B = I_o \exp(U_B:U_T)$$

($U_T$ = thermal voltage of the diode).

From the foregoing it can be immediately concluded that:

$$I_C:I_B = \exp((U_C - U_B):U_T) \text{ and}$$

$$\log \text{ nat } B = \Delta U:U_T \text{ and}$$

$$\Delta U = U_T \cdot \log \text{ nat } B.$$

If there are two diodes, the voltage $U_T$ and also the voltage $\Delta U$ will double.

If there is, for example, a value for current amplification B of 200, the associated voltage U becomes 318 mV and if the amplification B has a value of 100, the voltage $\Delta U$ becomes 276 mV, and with an amplification factor of 50 the voltage $\Delta U$ becomes 235 mV. The voltage $U_T$ increases with rising temperature. The value of the voltage $U_T = 30$ mV was determined at one diode by means of 3-connected diodes.

With respect to the realization of a memory cell constructed in accordance with the present invention in a monolithically integrated form a number of possibilities exist. However, in the present case only one possibility shall be discussed which assures a particularly high packing density and which also permits fabrication in the so-called 3D technique, that is by three times redoping, so that it is possible to carry out the process without the use of an epitaxial technique.

This method comprises producing at a planar surface of a semi-conductor crystal Si (FIGS. 4 and 5) of one conductivity type, four zones $Z_1$, $Z_1^*$ and $Z_2$, $Z_2^*$ in each case arranged with respect to each other approximately like a four-leaf clover, but separated from one another by the original conductivity type of material, the four zones being of the opposite conductivity type and produced by masked diffusion and/or ion implantation and by further redoping processes within a first one of these redoped zones, for example, the zone $Z_1$, as well as within a second zone adjacent the redoped zones, $Z_2$ for example one of each of the two transistors $T_1$ and $T_2$ as well as one each Schottky diode $SD_1^*$ and/or $SD_2^*$ are produced in such a manner that the Schottky diode and the collector of the relevant transistor are connected in series and the Schottky diode is located in the flow direction with respect to the collector of the transistor involved. Moreover, for the production of a second Schottky diode $SD_1$ and/or $SD_2$ are each of the other two zones $SD_1^*$ and $SD_2^*$ originating from the first redoping process, the zones being of the conductivity type opposite to that of the semi-conductor crystal Si, a Schottky contact is likewise applied and finally the electrical connections are produced between both of the transistors $T_1$, $T_2$ and the Schottky diodes by conductive paths applied to an insulating layer covering the semi-conductor body and insulated with regard to each other at the points of intersection.

Figure 5:
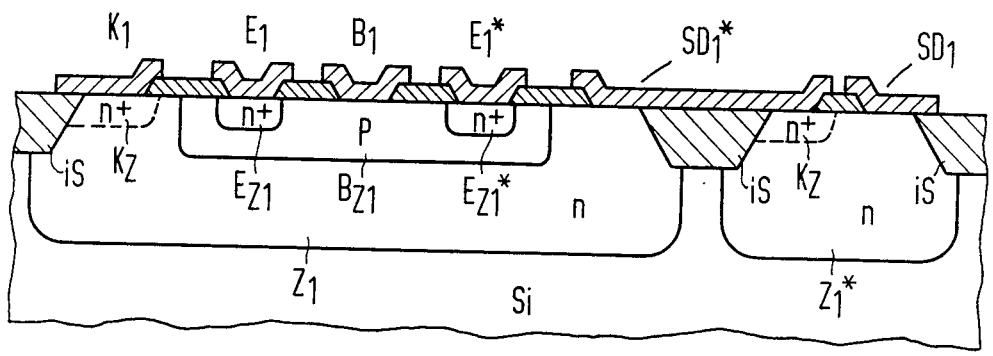
FIG. 5 is a longitudinal sectional view taken along the parting line I—I' of FIG. 4.
Figure 4:
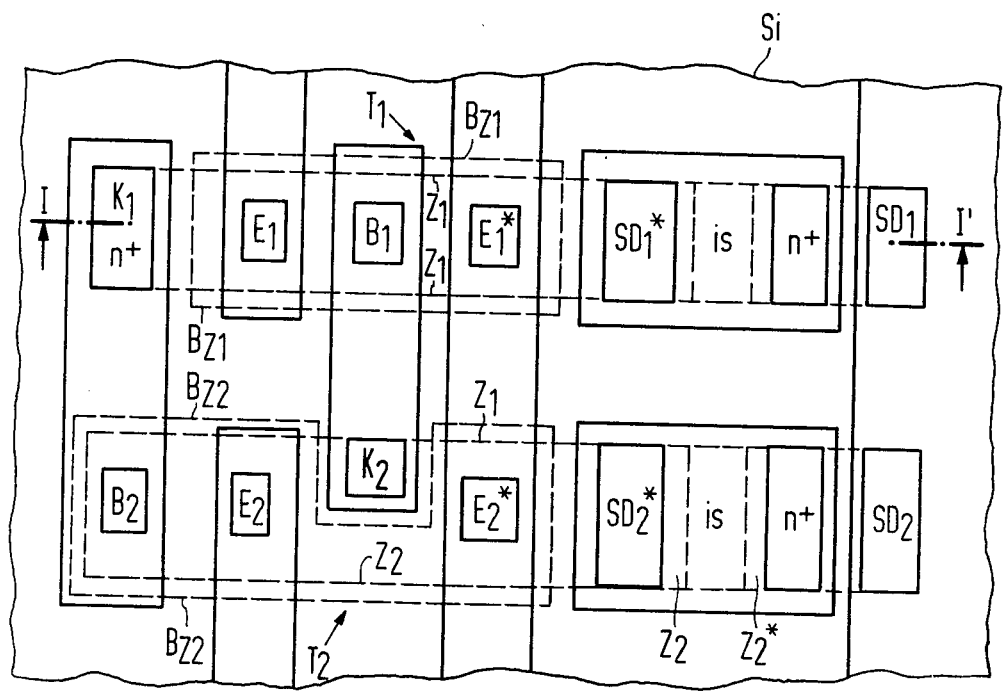
FIG. 4 is a plan view of a monolithically integrated semi-conductor circuit constructed in accordance with the invention.

This leads, for example, to an embodiment as can be seen in FIGS. 4 and 5, FIG. 5 being a longitudinal section taken along the parting line I—I' of FIG. 4.

Beginning with a p-doped silicon crystal Si, four zones $Z_1$, $Z_2$, $Z_1^*$, $Z_2^*$, separated from each other, are produced by localized redoping on a planar surface of the crystal. The zones, viewed from above, are placed in relation to each other approximately in the manner of a four-leaf clover. The zones $Z_1$, $Z_2$, $Z_1^*$, $Z_2^*$ which remain clearly separated by strips of the original p-doping remaining therebetween (even if the width of these strips is made as small as possible in the interest of packing density being as large as possible) receive a donor excess and thus become n-conductive, with doping being adjusted in such a manner that each of the zones can be processed further into a collector or an npn transistor. This is the first part of the 3D process.

The second step of the process is in accordance with that described in the German Patent Application P No. 26 10 208.9-33 and is recommended to improve the insulation between two adjacent zones of each of these four zones of the opposite conductivity type, that is in the case of the example the n-type. This is accomplished by a respective trench iS produced between the zones $Z_1$ and $Z_1^*$ and between the zones $Z_2$ and $Z_2^*$, the trench then being filled with insulating material, particularly $SiO_2$.

The second part of the actual 3D process which follows the production of the insulating trenches iS relates to the production of the base zones $B_{Z1}$ and $B_{Z2}$ of the two transistors $T_1$ and $T_2$ by the localized introduction of acceptor material into the two adjacent zones created by the first redoping process. In this example, the zones $Z_1$ and $Z_2$ are used for this purpose.

The third part of the 3D process relates to the production of the total of the four emitter zones $E_Z$ of the two transistors as well as of one contacting zone $K_Z$ in each of the two zones not to be completed into a transistor and originating from the first read open process, that is of the zones $Z_1^*$ and $Z_2^*$ and in the remaining portions of $Z_1$ and $Z_2$.

Following the removal of the diffusion and implantation masks (the thick insulating layer in the trenches iS is preserved to a large extent by corresponding synchronization of the etching time and/or the etching means) the surface of the total arrangement is covered with a pure $SiO_2$ layer O, in which the contacting windows lead through the preserved portions of the transistor collector zones formed by the redoped zones $Z_1$ and $Z_2$, of the base zones $B_{Z1}$, $B_{Z2}$, of the two transistors $T_1$, $T_2$ to the emitter zones $E_{Z1}$, $E_{Z1}^*$, $E_{Z2}$, $E_{Z2}^*$ of the two transistors. In addition, discrete windows are produced for the four contacting zones $K_Z$ which, like the emitter zones, are of the n+-type.

It should be pointed out in this connection that for the contacting of the two collector zones the n+-doped contact zones $K_Z$ produced in the two collector zones are provided, while the two contact windows leading directly to the only n-doped portion of the collector zones are used to produce each Schottky diode.

It is recommended to complete the contacts $K_1$, $K_2$ to the collector zones, $B_1$ and $B_2$ to the base zones, $E_1$, $E_1^*$, $E_2$ and $E_2^*$, as well as the Schottky contacts for the Schottky diodes $SD_1$, $SD_1^*$, $SD_2$ and $SD_2^*$ in a single metallizing process. In order to achieve this goal, the donor doping of the four zones $Z_1$, $Z_2$, $Z_1^*$ and $Z_2^*$ is adjusted outside the n+-doped contacting zones $K_2$ produced therein in that the layer of contacting metal to be applied by vaporization and/or sputtering and/or by electrolytic separation and to be sintered forms a rectifying Schottky contact, while the portions of this metal layer applied simultaneously at the contacting zones $K_Z$ only lead to one contact free from blockage. Aluminum, but also platinum, palladium, chrome and titanium or another metal known for this purpose, may be used as the contacting metal.

The production of the electrical connections according to FIG. 3 is effected in the usual manner, whereby attention must be paid to corresponding insulation of intersecting conductor paths. If necessary, at least part of the production of the conductor paths may be completed simultaneously with the production of the electrical contacts.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. A monolithically integrated semiconductor memory cell comprising:
    first and second transistors each having a base, first and second emitters and a collector;
    said first emitters connected in common to a first potential;
    said second emitters serving as inputs for receiving logic signals;
    said base of said first transistor connected to said collector of said second transistor, and said base of said second transistor connected to said collector of said first transistor; and
    first and second nonlinear load circuits respectively connecting said collectors to a second potential,
    each of said load circuits including two Schottky diodes connected in series and poled in the current-flow direction of the respective transistor,
    said Schottky diodes having an increasing slope of the current-voltage characteristic which is greater throughout the increasing slope than the corresponding current values in the current-voltage characteristic of the emitter-base pn junctions of said first and second transistors.

* * * * *